US008431819B2

(12) United States Patent
Pitkonen et al.

(10) Patent No.: US 8,431,819 B2
(45) Date of Patent: Apr. 30, 2013

(54) CASING WITH CHANNEL DISCONTINUITY THAT RESISTS CAPILLARY ACTION

(75) Inventors: Jussi Pitkonen, Espoo (FI); Masao Osada, Helsinki (FI); Michael Vilen, Kaarina (FI); Eero Mäki-Tulokas, Vaskio (FI)

(73) Assignee: Nokia Corporation, Espoo (FI)

( * ) Notice: Subject to any disclaimer, the term of this patent is extended or adjusted under 35 U.S.C. 154(b) by 654 days.

(21) Appl. No.: 12/300,109

(22) PCT Filed: May 4, 2007

(86) PCT No.: PCT/EP2007/003952
§ 371 (c)(1),
(2), (4) Date: Apr. 22, 2009

(87) PCT Pub. No.: WO2007/131647
PCT Pub. Date: Nov. 22, 2007

(65) Prior Publication Data
US 2009/0296357 A1 Dec. 3, 2009

(30) Foreign Application Priority Data
May 11, 2006 (GB) .................................. 0609344.7

(51) Int. Cl.
*H05K 5/00* (2006.01)
*H02G 3/08* (2006.01)

(52) U.S. Cl.
USPC ........................................... 174/50; 361/752

(58) Field of Classification Search .................. 361/725
See application file for complete search history.

(56) References Cited

U.S. PATENT DOCUMENTS

| 1,839,340 | A | * | 1/1932 | Pittlick ........................ 220/801 |
| 4,335,273 | A | * | 6/1982 | Levin ............................ 277/641 |
| 4,421,966 | A | * | 12/1983 | Pounds ......................... 200/309 |
| 4,654,470 | A | * | 3/1987 | Feldman et al. ................ 174/50 |
| 4,973,797 | A | * | 11/1990 | Jorgensen et al. .............. 174/53 |
| 5,310,075 | A | * | 5/1994 | Wyler .......................... 220/4.02 |
| 5,769,648 | A | * | 6/1998 | Hayashi ....................... 439/206 |
| 5,860,822 | A | * | 1/1999 | Nishide et al. ................ 439/206 |

(Continued)

FOREIGN PATENT DOCUMENTS

| DE | 87 17 329 | 1/1988 |
| DE | 20105495 | 11/2001 |

(Continued)

OTHER PUBLICATIONS

Great Britain Search Report for Great Britain Application No. GB 0609344.7 mailed Sep. 5, 2006.

(Continued)

*Primary Examiner* — Timothy Thompson
*Assistant Examiner* — Nathan Milakovich
(74) *Attorney, Agent, or Firm* — Harrington & Smith

(57) ABSTRACT

A casing (100, 200) for housing one or more electronic components for an electronic device in the casing interior, the casing comprising first (100) and second parts (200) having respective mateable surfaces having one or more mateable edges, the mating edges being arranged to define a channel (300) therebetween in the mated condition, the channel (300) extending from the exterior of the casing towards the interior of the casing, and wherein the channel (300) is arranged to comprise a discontinuity (303) arranged to resist capillary action.

27 Claims, 17 Drawing Sheets

Case a) reduces capillarity inwards, but enables capillarity outwards.

Case b) reduces capillarity outwards, but allows capillarity inwards.

U.S. PATENT DOCUMENTS

| | | | |
|---|---|---|---|
| 6,219,258 B1 * | 4/2001 | Denzene et al. | 361/816 |
| 6,273,426 B1 | 8/2001 | Daoud et al. | |
| 6,568,551 B2 * | 5/2003 | Grossenbacher | 220/4.02 |
| 7,017,764 B2 * | 3/2006 | Okada | 220/3.2 |
| 7,414,190 B2 * | 8/2008 | Vo | 174/50 |
| 2002/0084272 A1 | 7/2002 | Grossenbacher | 220/4.21 |
| 2004/0084465 A1 * | 5/2004 | Luburic | 220/792 |
| 2005/0141738 A1 | 6/2005 | Karamuk | |

FOREIGN PATENT DOCUMENTS

| | | |
|---|---|---|
| EP | 1 096 759 | 5/2001 |
| EP | 1 215 950 | 6/2005 |
| EP | 1 650 777 A1 | 4/2006 |
| EP | 1650777 | 4/2006 |
| GB | 2 433 548 A | 6/2007 |
| JP | 08298158 | 11/1996 |
| JP | 2008298158 A | 12/2008 |

OTHER PUBLICATIONS

PCT Search Report for PCT Application No. PCT/EP2007/003951 mailed Nov. 20, 2007.

* cited by examiner

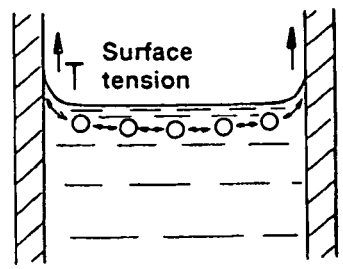
Fig. 1
(PRIOR ART)
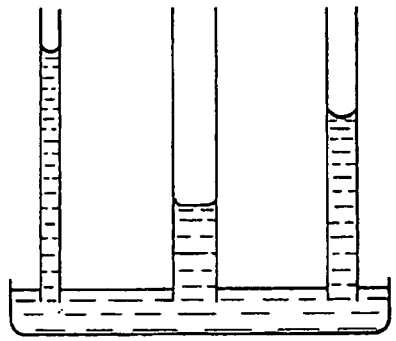
Fig. 2
(PRIOR ART)
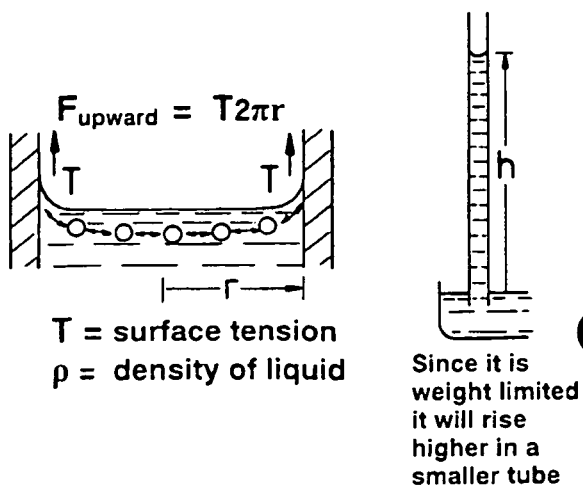
T = surface tension
ρ = density of liquid
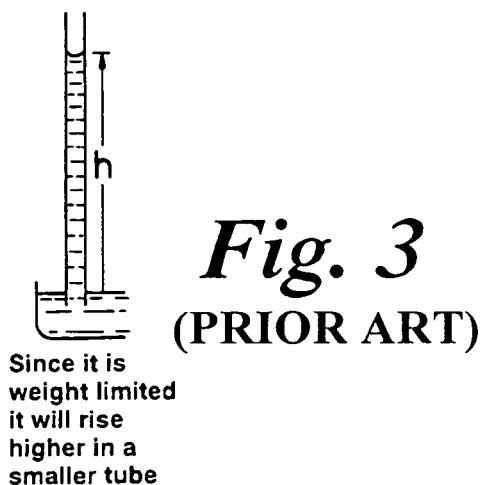
Fig. 3
(PRIOR ART)
Since it is weight limited it will rise higher in a smaller tube

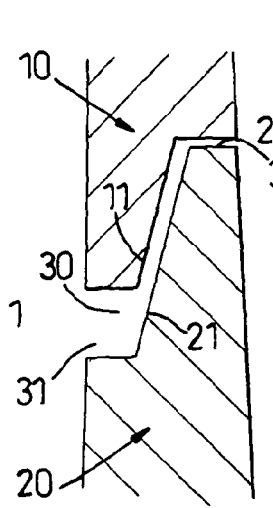
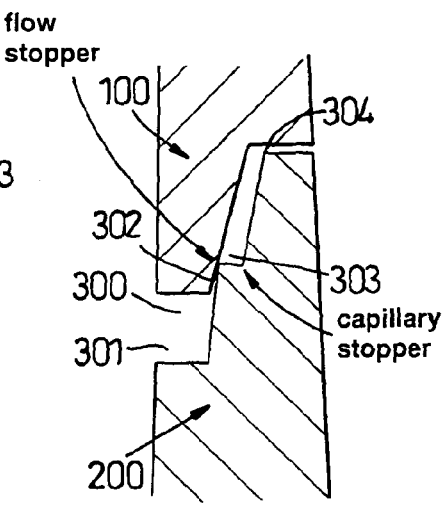
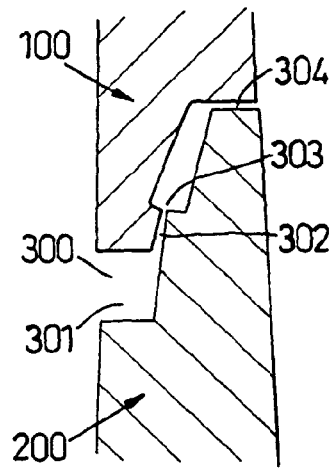
*Fig. 5(a)*
*(PRIOR ART)*
*Fig. 5(b)*
*Fig. 5(c)*
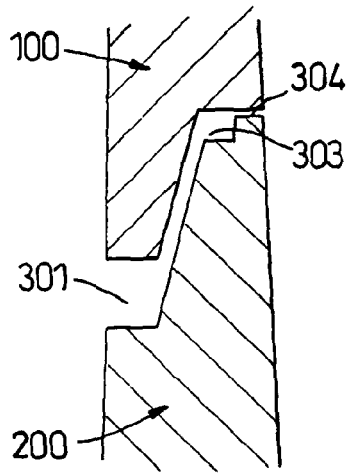
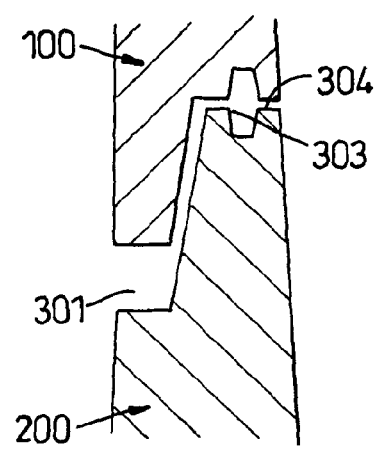
*Fig. 5(d)*
*Fig. 5(e)*
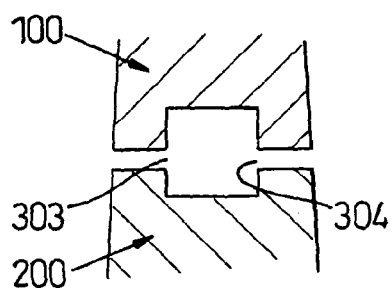
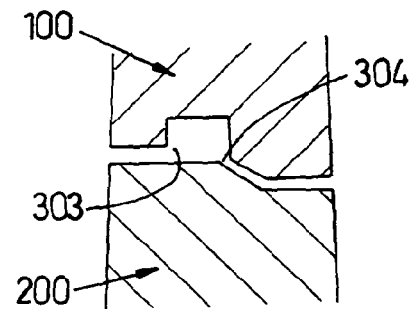
*Fig. 5(f)*
*Fig. 5(g)*

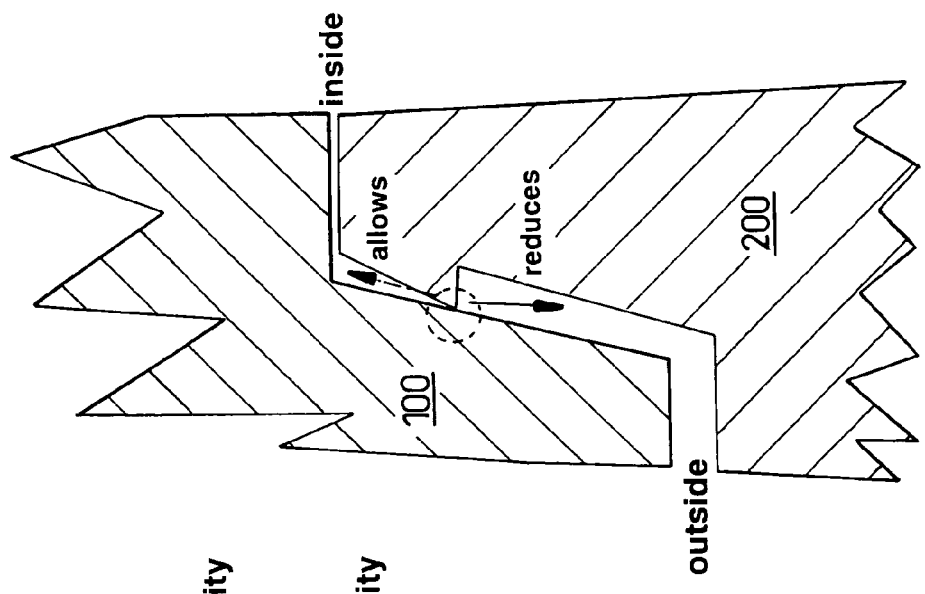
*Fig. 10(b)*
Case a) reduces capillarity inwards, but enables capillarity outwards.
Case b) reduces capillarity outwards, but allows capillarity inwards.
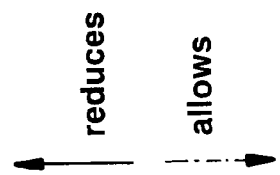
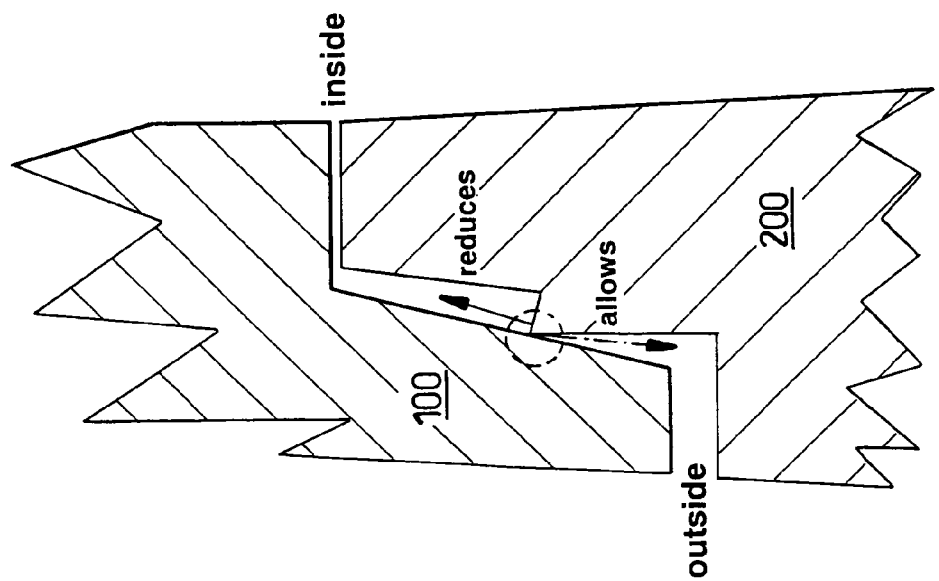
*Fig. 10(a)*

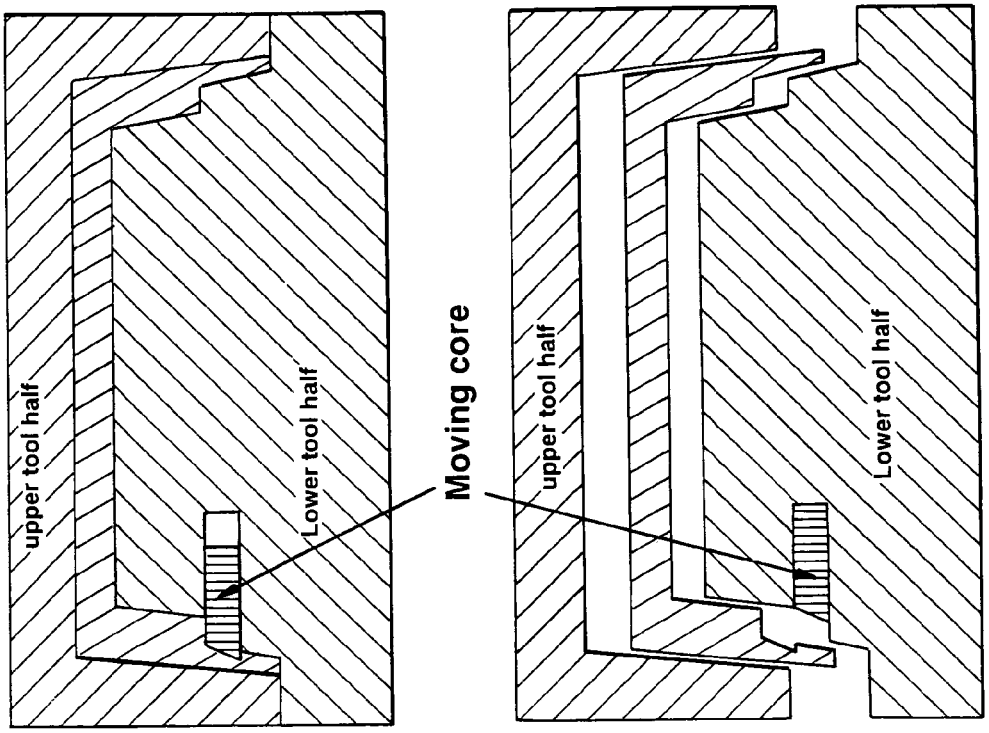
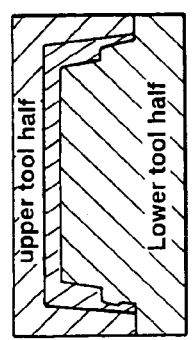
Counterdraft → Moving core needed
Due to counter draft in part, a moving element ("core") has to be added in the lower half of the tool.
Before opening the tool, the moving core is drawn back, which enables normal opening movement of the tool
*Fig. 14*

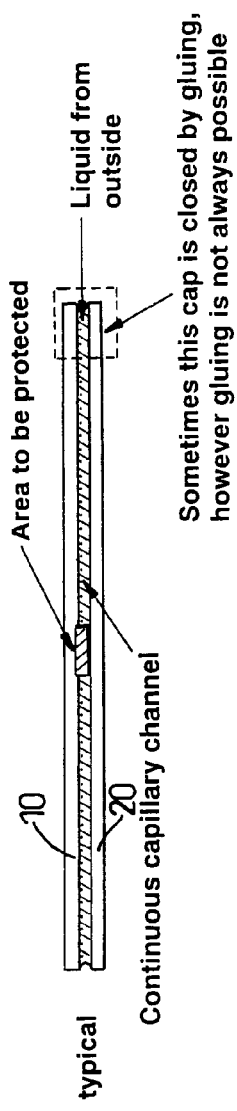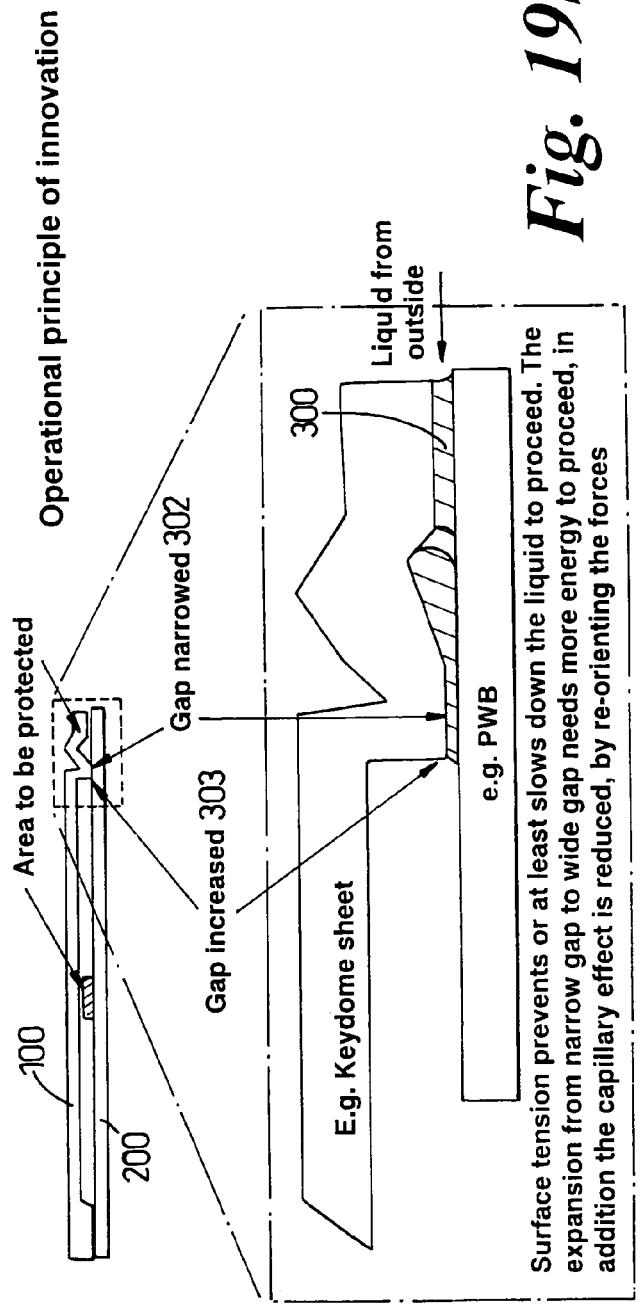

CASING WITH CHANNEL DISCONTINUITY THAT RESISTS CAPILLARY ACTION

FIELD OF THE INVENTION

The present invention relates to liquid sensitive electronic products, and in particular to the field of electronic device casings, and methods (including methods of assembly) and apparatus to produce such casings. The electronic device casings are used to encase/house (either fully or partially) one or more (electronic) components of the electronic device.

The casings may be used to form the exterior housing of an electronic device, or be used as an interior housing which is not ordinarily accessible to a user. The casing may be made from a number of user removable casing parts, for example, one embodiment could be a modified form of user removable (e.g. user removable by hand without any tools) fascias, such fascias being currently popularly used to personalise the exterior of a mobile phone, for example.

According to one or more particular embodiments of the present invention, the electronic device casings can be a casing for the entire electronic device, or a casing for one or more components parts of the electronic device. Considering a casing for the entire electronic device, the electronic device casing of the present invention includes, but is not limited to, the exterior casings used to house an electronic device comprising radiotelephone functionality. Such radiotelephone electronic devices can comprises mobile cellular telephones and associated network devices, Wireless Local Area Network (WLAN) enabled devices, Bluetooth™ enabled devices, and developments thereof. In the case of a casing for one or more components of the electronic device, the casing could house one or more of the components used to make one or more of the aforementioned electronic devices.

The present invention can also be applied to the interface between a Printed Wiring Board (PWB) and a keypad dome sheet, or a PWB and a display/camera module, or a PWB and the so-called A/B/C covers of mobile cellular phones.

The present invention also encompasses electronic device casings for desktop/laptop computers, which may, or may not, comprise radiotelephone functionality. It will be appreciated that the present invention could be applied to a multitude of electronic device casings, whether the casing is used to house a complete electronic device or one or more components thereof. PWBs are generally planar (flat) in nature and the present invention is applicable to interfaces between a planar structure to inhibit the ingress of liquid.

The electronic devices may or may not provide one or more of audio/video functionality, music functionality (e.g. an MP3 player), digital image processing (including the capturing of a digital image), and/or controlling the operation of a remote apparatus (e.g. printer, monitor) which may be connected over a wire or over the air interface.

BACKGROUND

Electronic devices comprising electronic components are housed in casings. The casings protect the electronic components from damage. Electronic components are particularly sensitive to damage from liquids, for example, caused by interaction with water (with or without impurities). With liquid, harming particles (e.g. ions) can access sensitive areas inside the electronic device and cause, for example, corrosion, electrochemical migration and/or short circuiting of the electronic device.

Electronic casings are often made from multiple (housing) parts which are joined together along sealing lines. Unless measures are taken, these sealing lines will allow the ingress of liquid into the casing, leading to damage of the electronic components contained therein. Even quite narrow channels will allow the ingress of liquid into the casing.

One key transfer method of liquids, particularly in narrow channels, is capillary attraction (often referred to as capillary action), in which liquid transfers in capillary channels driven by capillary force. These capillary channels are typically formed between different exterior parts, such as the so-called A and B casing covers of a mobile phone. However, such channels can also be formed between interior components, such as between a Printed Wiring Board (PWB) and a keypad dome sheet in a mobile phone.

The problem of liquid ingress into electronic devices is a widely recognised problem. Some solutions focus on liquid (water) resistance increase, for example, by using different kind of seals between components, or even integrating seals into the casing components. This increases material cost/manufacturing/assembling complexity. Some solutions focus on increasing moisture/liquid resistance of critical components themselves. Again, this also increases material cost.

SUMMARY

According to a first aspect, the present invention provides a casing for housing one or more electronic components for an electronic device in the casing interior, the casing comprising first and second parts having respective mateable surfaces having one or more mateable edges, the mateable edges being arranged to define a channel therebetween in the mated condition, the channel extending from the exterior of the casing towards the interior of the casing, and wherein the channel is arranged to comprise a discontinuity arranged to resist capillary action.

The discontinuity may be arranged to provide an abrupt increased gap with respect to an adjacent portion of the channel.

The channel discontinuity may be arranged to re-orientate the direction of surface tension force in the channel to reduce capillary action from the casing exterior to the casing interior.

The channel discontinuity may comprise a sharp corner. The channel discontinuity may comprise opposing sharp corners.

The channel discontinuity may be formed in the channel towards the exterior of the casing i.e. nearer the exterior of the casing than the interior.

The discontinuity may be arranged to provide an abrupt increased gap with respect to an adjacent portion of the channel, the adjacent portion of the channel being towards the exterior of the casing.

The channel discontinuity may be formed in the channel towards the interior of the casing i.e. nearer the interior of the casing than the exterior.

The channel discontinuity may be formed in the channel in the middle between the interior and exterior of the casing.

The channel discontinuity may be arranged to narrow towards the interior of the casing to provide a reduced gap towards the interior of the casing.

The channel discontinuity may be arranged to narrow towards the interior of the casing to provide a gradually reducing gap towards the interior of the casing The channel discontinuity may be arranged to comprise an abrupt narrowing of the channel gap towards the interior of the casing.

The channel may be arranged to narrow from the exterior of the casing, and wherein the discontinuity is formed at the narrowing of the channel.

The channel may be arranged to define a first gap at the exterior of the casing, and a second narrower gap towards the interior of the casing, and wherein the discontinuity is formed at the second narrower gap.

The first and second parts may form an exterior casing of/for the electronic device.

The first and second parts may form an exterior casing of/for one or more components of the electronic device.

The first and second parts may form an interior casing of/for the electronic device.

The first and second parts may form an interior casing of/for one or more components of the electronic device.

The first part may be a PWB and the second part may be a keypad dome sheet.

The channel may extend radially around the perimeter of the casing (around the mateable surfaces).

The channel may extend radially around the complete perimeter of the casing rather than just part of the mateable surfaces.

According to another aspect, the present invention provides a casing part of a casing according to the first aspect of the present invention.

According to another aspect, the present invention provides a mould for producing a casing according to the first aspect of the present invention.

According to another aspect, the present invention provides an electronic device comprising a casing according to the first aspect of the present invention.

According to a further aspect, the present invention provides a method of manufacturing a casing for housing one or more electronic components for an electronic device in the casing interior, the casing comprising first and second parts having respective mateable surfaces having one or more mateable edges, the mateable edges being arranged to define a channel therebetween in the mated condition, the channel extending from the exterior of the casing towards the interior of the casing, and wherein the channel is arranged to comprise a discontinuity arranged to resist capillary action.

According to a further aspect, the present invention provides a means for housing one or more electronic components for an electronic device in the interior of the means for housing, the means for housing comprising first and second means for housing parts having respective conforming faces arranged to be brought together such that the means for housing provides a housing for one or more of the electronic components, wherein the conforming faces are arranged to define one or more means for liquid access therebetween in the brought together condition, one or more of the means for liquid access extending from the exterior of the means for housing towards the interior of the means for housing, and wherein one or more of the means for liquid access is arranged to comprise a discontinuity arranged to resist capillary action.

The present invention encompasses one or more aspects and/or embodiments of the invention in isolation and one or more combinations, whether or not specifically mentioned (or claimed) in that combination or in isolation. Although moulding methods are described, aspects and embodiments of the present invention may be manufactured using other processes, including grinding, forming and stamping.

BRIEF DESCRIPTION OF FIGURES

One or more specific embodiments of the present invention will be described with reference to the accompanying figures in which:

FIG. 1 illustrates the forces in operation at the surface of a liquid contained in a vessel with vertical sides;

FIG. 2 illustrates the height variation of liquid columns in tubes as a function of tube radius;

FIG. 3 is similar to FIG. 1 and illustrates, in closer detail, the forces in operation at the surface of a liquid contained in a vessel with vertical sides;

FIG. 5 compares, in vertical cross section, channel designs according to six different embodiments (FIGS. 5 *b-g*) of the invention with a prior art channel design (FIG. 5*a*);

FIG. 10 illustrates the importance of discontinuity direction in embodiments of the present invention;

FIGS. 12, 13 and 14 illustrate moulding tool configurations in relation to the manufacture of one or more embodiments of the present invention;

FIG. 19 illustrates the prior art way of sealing PWBs (FIG. 19*a*) and compares this to one way according to the present invention (FIG. 19*b*).

Although vertical cross sections are compared in FIG. 5, it will be appreciated that the present invention can also be applied to cross sections in horizontal. Thus, FIG. 5 could be considered to show horizontal cross sections of various channel designs.

DETAILED DESCRIPTION OF SPECIFIC EMBODIMENTS

Let us first consider some basic principles.

Surface tension is an effect within the surface layer of a liquid that causes the layer to behave as an elastic sheet. It is the effect that allows insects to walk on water, and causes capillary action, for example.

Surface tension is caused by the attraction between the molecules of the liquid, due to various intermolecular forces (FIG. 1). In the bulk of the liquid, each molecule is pulled equally in all directions by neighbouring liquid molecules, resulting in a net force of zero. At the surface of the liquid, the molecules are pulled inwards by other molecules deeper inside the liquid, but there are no liquid molecules on the outside to balance these forces, so the surface molecules are subject to an inward force of molecular attraction which is balanced by the resistance of the liquid to compression. There may also be a small outward attraction caused by air molecules, but as air is much less dense than the liquid, this force is negligible.

Figure 4:
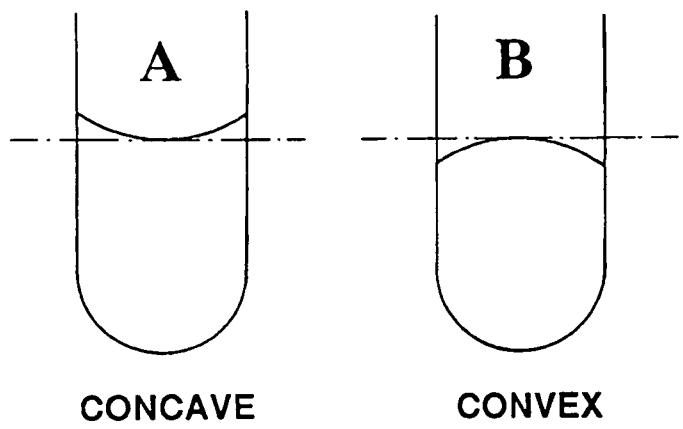
FIG. 4 illustrates concave and convex meniscus shapes.

A meniscus is a curve in the surface of a liquid and is produced in response to the surface of the container or another object. It can be either concave or convex (FIG. 4). A convex meniscus occurs when the molecules of the liquid repel the molecules of the container or object. This may be seen between mercury and glass in barometers. Conversely, a concave meniscus occurs when the molecules of the liquid attract those of the container. This can be seen between water and glass. Surface tension acts on concave menisci to pull the liquid up, and on convex menisci to pull the liquid down.

Capillary action is the result of adhesion and surface tension. For example, adhesion of water to the walls of a vessel will cause an upward force on the liquid at the edges and result in a meniscus which turns upward. The surface tension acts to hold the surface intact, so instead of just the edges moving upward, the whole liquid surface is dragged upward (FIGS. 2 and 3).

Capillary action or capillarity (also known as capillary motion) is the ability of a narrow tube to draw a liquid upwards against the force of gravity. It occurs when the adhesive intermolecular forces between the liquid and a solid are stronger than the cohesive intermolecular forces within the liquid. The effect causes a concave meniscus to form where the liquid is in contact with a (e.g. vertical/horizontal/inclined) surface. The same effect is what causes porous materials to soak up liquids.

A common apparatus used to demonstrate capillary action is the capillary tube. When the lower end of a vertical glass tube is placed in a liquid such as water, a concave meniscus forms. Surface tension pulls the liquid column up until there is a sufficient weight of liquid for gravitational forces to overcome the intermolecular forces. The weight of the liquid column is proportion to the square of the tube's diameter, but the contact area between the liquid and the tube is proportional only to the diameter of the tube, so a narrow tube will draw a liquid column higher than a wide tube (FIG. 2). For example, a glass capillary tube 0.5 mm in diameter will lift a theoretical 2.8 cm column of water. Actual observations show shorter total distances.

With some pairs of materials, such as mercury and glass, the interatomic forces within the liquid exceed those between the solid and the liquid, so a convex meniscus forms and capillary action works in reverse (FIG. 4). The present invention is not applicable to mercury.

The height h (m) of a liquid column (FIG. 3) is given by:

$$h = (2.T.\cos \alpha)/(\rho g r) \quad (1)$$

where
T=surface tension (J/m$^2$)
α=contact angle
ρ=density of liquid (kg/m$^3$)
  g=acceleration due to gravity (m/s$^2$)
  r=radius of tube (m)

Let us now consider embodiments of the present invention, and compare these embodiments of the present invention with a prior art configuration. In the examples discussed below, the embodiments will relate to an exterior electronic device casing formed from two parts. The interior of the casing houses the electronic components.

In these particular embodiments, the casing fully encases the exterior of the electronic device components and, as such, is the casing which is presented to a user. However, it is important to note that the present invention is not limited to exterior electronic device casings, and could be applied to interior electronic device casings which are not ordinarily visible to a user. Also, the present invention could be applied to casings formed from more than two parts, and/or casings which do not fully encase the electronic device components.

It will also be appreciated that although a channel is formed along one cross section of the mating surfaces/edges, the channel may, or may not, extend entirely around the mating edge (i.e. parts of the mating edges may be touching and thus not define a channel).

Consider a prior art configuration as shown in FIG. 5a. FIG. 5a illustrates a cross section through a casing formed from two parts 10, 20. The two parts 10, 20 can be brought together along mateable surfaces (i.e. a degree of conforming such that they can be brought together) having one or more mating edges 11, 21. The mateable surfaces may not necessarily be in touching contact along their entire perimeter. This is the case in the cross section shown in FIG. 5a in which a channel 30 is defined between the mating edges 11, 21 at a particular location where the mating edges are not in contact (adjacent regions to the cross section of FIG. 5a may be in touching contact). The channel 30 extends from the exterior 1 of the casing into the interior 2 of the casing. In other cross sections (not shown) the channel 30 may not extend completely from the interior 2 to the exterior 1 but may have one or more contact points.

The channel dimension (i.e. the gap defined between the two mating parts) varies along its length. At the exterior of the casing, the channel dimension is comparatively large (31). Then, the channel dimension reduces along its length, until the interior of the casing, where the channel dimension is the smallest (33). In this arrangement, capillary action causes liquid to be transported within the channel 30, from the exterior to the casing interior. Once the channel narrows, it does not increase in dimension. Also, after narrowing from the initial large dimension (31) at the casing exterior, the channel dimension is continuous, with no significant disruption (change of size) in the channel dimension.

Let us now consider a number of embodiments of the present invention.

In a first embodiment as illustrated in FIG. 5b, the channel dimension 300 is also comparatively large (301) towards the exterior of the casing. The mating/conforming parts 100, 200 are arranged such that the channel 300 then gradually decreases (302). Then, at a particular point along the gradually decreasing channel 300, the mating parts are arranged to provide a sharp increase (303) in the channel dimension (i.e. a discontinuity in the channel dimension). From this sharp increase, the channel dimension then again gradually decreases in a direction towards the interior of the casing. Then, at another particular point, the mating parts are arranged such that channel dimension abruptly reduces (304). The mating parts 100, 200 may be arranged such that the channel dimension again gradually reduces toward the interior of the casing from the reduction in channel dimension (304).

Other embodiments are shown in FIGS. 5(c), 5(d) and 5(e). In each of these embodiments, the mating parts are arranged such that there is a sharp increase (discontinuity) in the channel dimension (303). In FIG. 5(c), the discontinuity is larger than the discontinuity of FIG. 5(b), as both mating parts 100, 200 are arranged to have reduced thickness to form the discontinuity. This is in contrast to the embodiment of FIG. 5(b), in which only mating part 200 has a reduced thickness to form the discontinuity. The embodiment of FIG. 5(e) is similar to the embodiment of FIG. 5(c) in this regard, and the embodiment of FIG. 5(d) similar to the embodiment of FIG. 5(b).

As shown in the embodiments of FIGS. 5(b) to 5(e), the position, shape and length of the discontinuity along the channel 300 can be varied. Also, the channel dimension (304)

after the discontinuity region towards the casing interior may not be a reducing dimension but could be constant (or even increasing).

FIG. 5(*f*) illustrates another embodiment in which the channel opening at the exterior of the casing is at the same level as the channel opening at the interior of the casing. Furthermore, the channel axis is substantially horizontal (in contrast to FIG. 5(*b*)-5(*e*) in which the channel axis is mostly vertical. In FIG. 5(*g*), the channel opening at the exterior is higher than the channel opening at the interior.

The vertical cross sections shown in FIG. 5 apply to mating parts 100,200 which are designed to be mated by, for example, placing the part 100 on top of the part 200 (in a horizontal plane in the configuration shown in FIG. 5). The present invention can also be applied to mating parts which are designed to be mated by axial sliding of the mating parts (i.e. mated in a vertical plane by rotating the configurations of FIG. 5 by 90°).

The discontinuity 303 may be conveniently formed at an opening for the injection mould tooling used to form the casing parts 100, 200. This opening can be the opening into which the molten material is injected into the mould in the injection moulding process.

Figure 6:
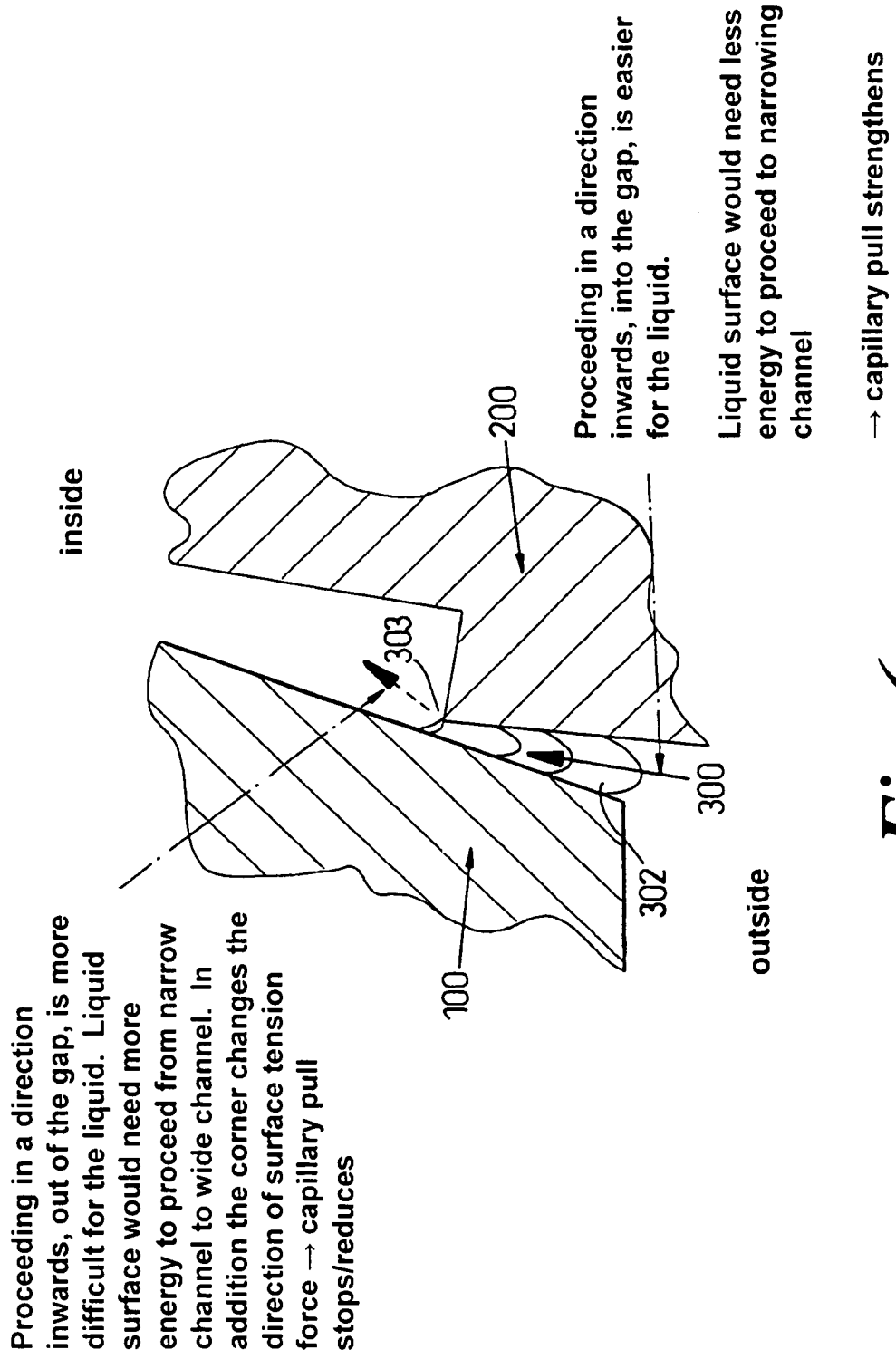
FIG. 6 illustrates the flow of liquid in a channel according to the present invention.

FIG. 6 shows a close up of the arrangement of FIG. 5*b*. It shows the flow of liquid in the channel 300, which is then stopped by the discontinuity 303. The meniscus of the liquid at the discontinuity is shown. The discontinuity (abrupt increase in channel dimension) inhibits capillary action. The discontinuity is arranged such that the surface tension is not sufficient to support the continued progression of liquid up the channel.

Figure 7:
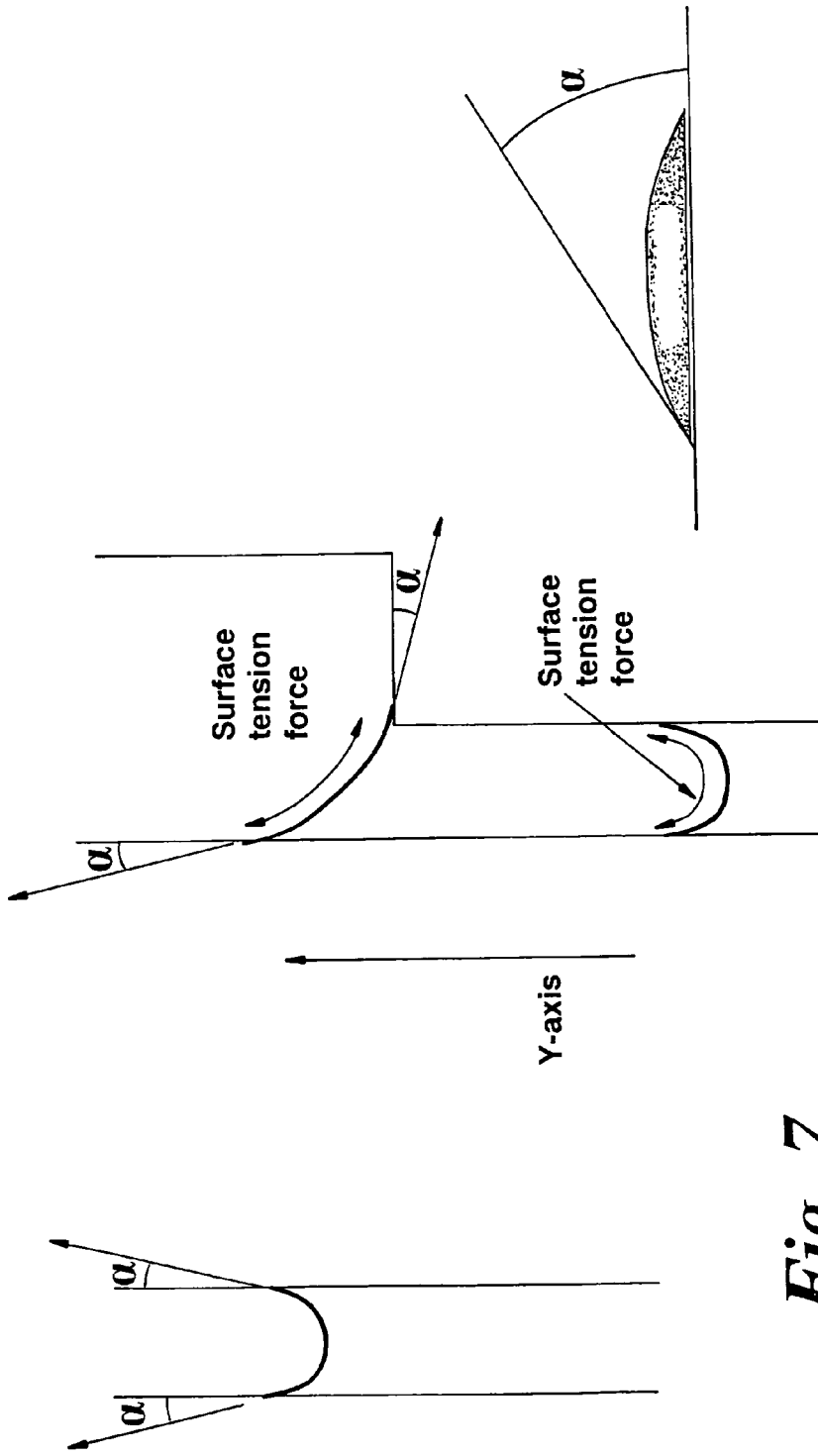
FIG. 7 illustrates the non-changing contact angle and the changing surface tension direction according to the present invention.

FIG. 6 show a narrowing 302 channel 300 in the upward direction. Capillary flow in this case is upwards. The narrowing causes the capillary action to get stronger. At the narrowest point, there is a 90 degrees step (discontinuity) on one side. The liquid surface follows the material round the corner, keeping the same contact angle (FIG. 7), which gives direction to surface tension. In comparison to the capillary flow direction (i.e. generally upwards) the surface tension is now pointed against the flow. This causes the flow to slow down/stop. On the other side (the straight wall), the liquid forms a normal meniscus, but also stops as it is due to surface tension (as it is redirected in the discontinuity).

As the narrowing 302 of the channel increases, the liquid surface needs less energy to proceed. Thus, the capillary action increases. Out of the gap, the liquid surface would need more energy to proceed from the narrowing of the channel into the widening 303. In addition, the corner changes the direction of surface tension and thus capillary pull stops/reduces.

Figure 8:
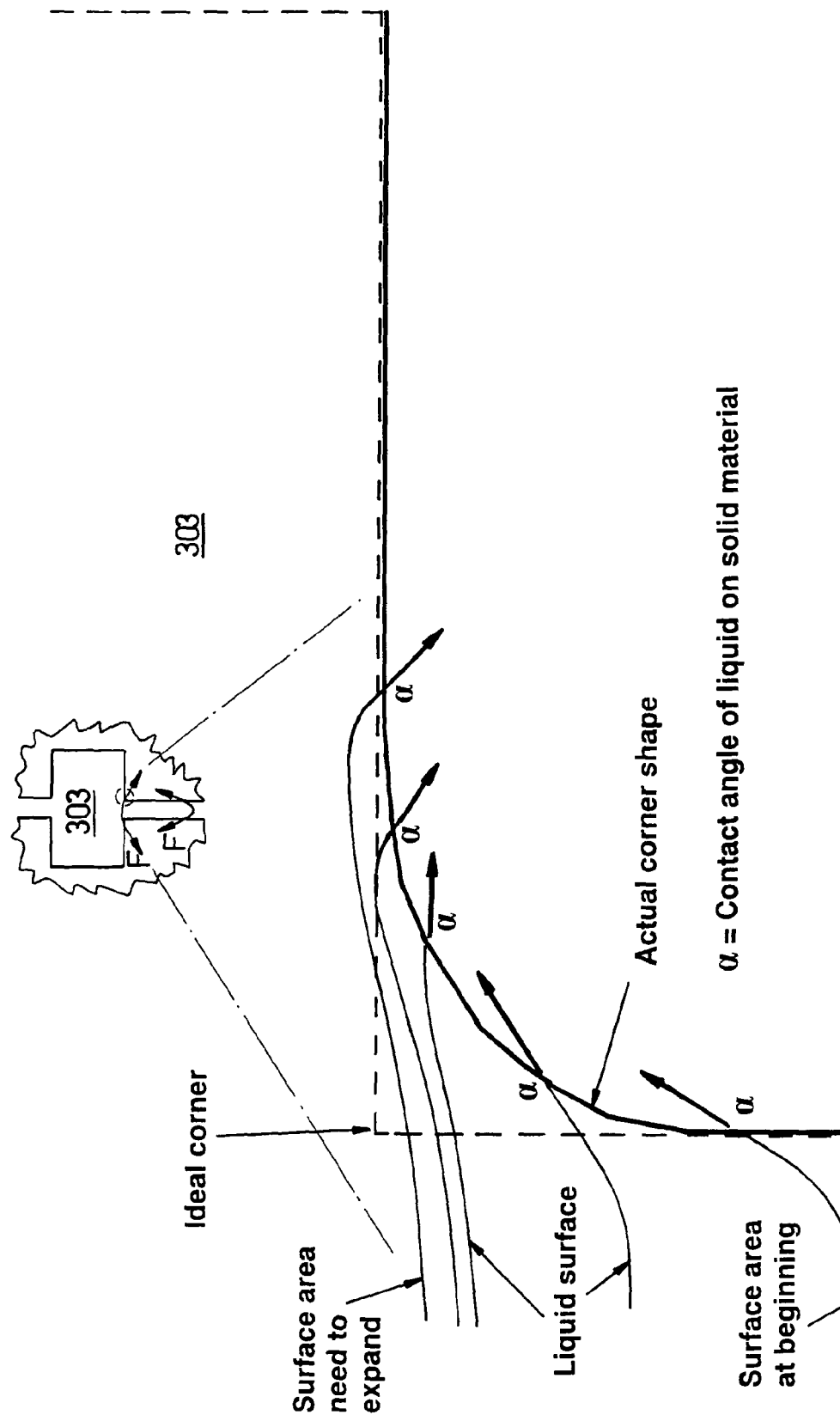
FIG. 8 illustrates the change of surface tension force orientation over a corner in an embodiment of the present invention.

FIG. 8 shows a detailed view of the arrangement of FIG. 5(*b*) and illustrates the changing meniscus at the edge of the mating part 200. In reality, it is very difficult to get a sharp corner ("ideal corner"), and thus the corner will be curved ("actual corner shape"). FIG. 8 shows that the direction of the surface tension force between the edge and the meniscus changes at the discontinuity as the same contact angle is maintained. The direction of the surface tension changes from one pulling the meniscus up the channel to one in which the surface tension acts to stop this upward pulling.

Figure 9:
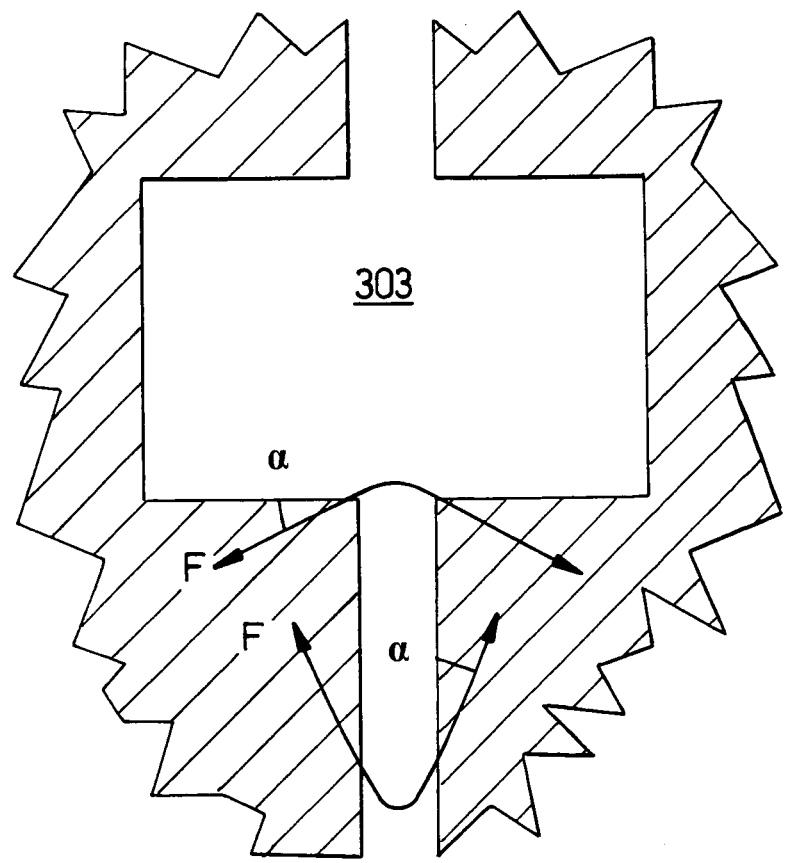
FIG. 9 illustrates the change in surface tension orientation in an embodiment of the present invention.

In the illustration of FIG. 8, and also in FIG. 9, the surface tension is shown to change such that it actually acts to push the meniscus in a downward direction. The surface tension force component directed towards the interior of the casing (i.e. up the channel) is reduced by the discontinuity, as compared to surface tension force component towards the interior of the casing in the channel (e.g. immediately) preceding the discontinuity.

With a suitable arrangement of the parts of the casing, capillary action can be prevented. This is based on the principle that the dynamic flow of liquid from the outside is first stopped in a tight fit (e.g. a narrowing of the channel dimension, which may be used in certain embodiments and not used in others) and the traditional capillary channel is cut with a (e.g. sharp) opening. In the opening, the gap between the mating parts increases significantly to stop or slow capillary based flow. This is based in two factors:

1) The meniscus must expand over the large gap provided by the discontinuity (the surface tension resisting this process);
2) The capillary forces are re-orientated against the capillary flow.

The narrowing of the channel may not always be needed, but it can be used to make the channel widening more dramatic, and thus more effective. The use of channel narrowing would depend on the dimensions of the channel.

The direction of the discontinuity is an important consideration. This is illustrated in FIG. 10*a* which shows that an abrupt increase in the channel from the casing exterior (outside) to the casing interior (inside) inhibits capillary action inwards, but facilitates capillary action outwards (FIG. 10*a*). However, in the case that there is an abrupt decrease in the channel from the casing exterior to the casing interior (FIG. 10*b*), capillary action from inside to outside is inhibited whereas capillary action from outside to inside facilitated.

Figure 11:
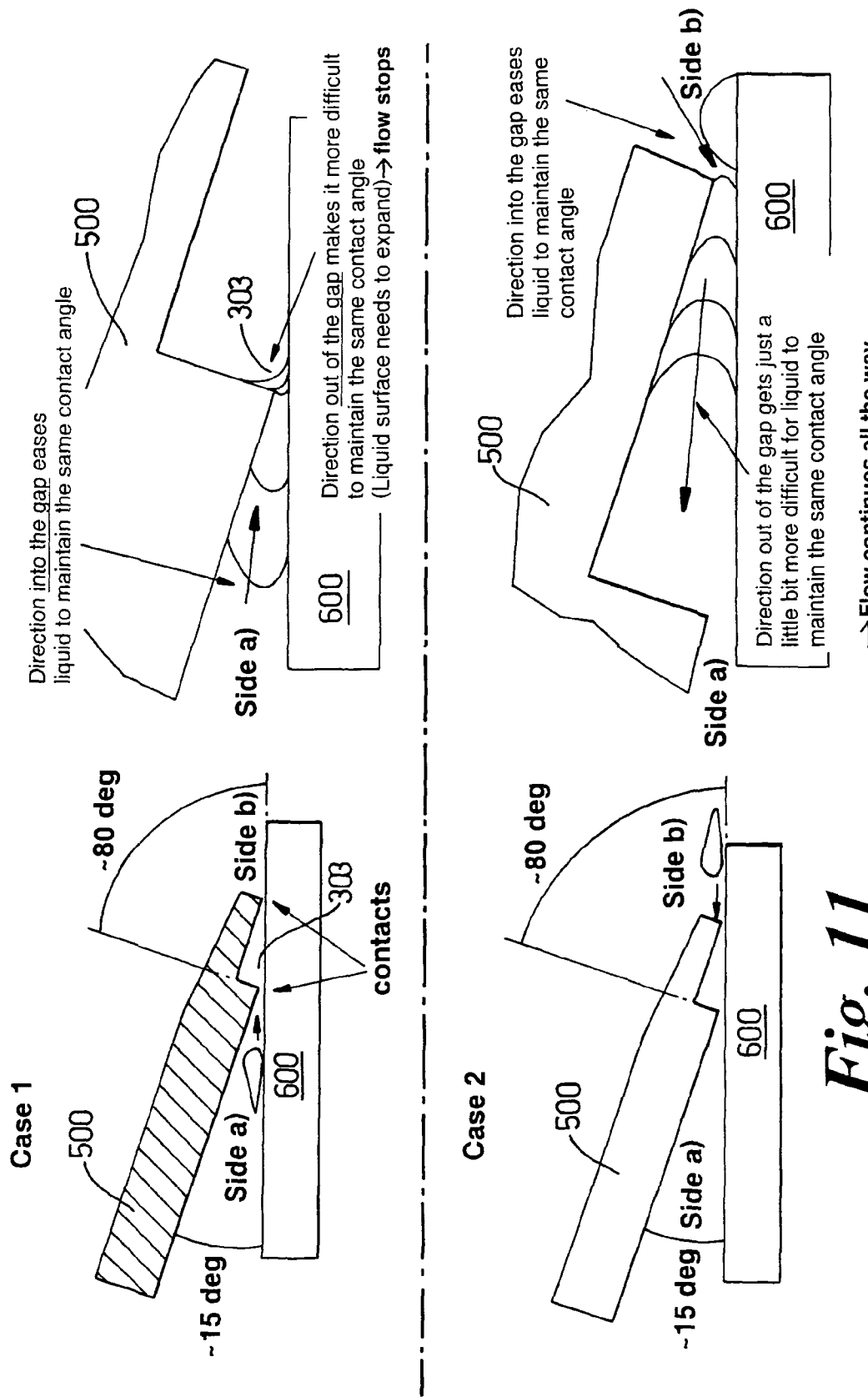
FIG. 11 illustrates the ruler test which can be used to show the principles behind the operation of the present invention.

The capillary action principles which are used in the present invention can be seen by using a ruler test (FIG. 11). In the ruler test, the end of a transparent plastic ruler 500 is cut to have a corner cut out of the cross section. When this edge is tilted (at 800) against a table 600 having a flat surface (e.g. smooth surface of glass, plastic, painted wood etc), a channel with a discontinuity 303 can be formed.

FIG. 11 illustrates two scenarios. In case 1 the liquid is placed in side a). In case 2, the liquid is placed in side b). In case 1, the direction out of the gap makes it more difficult to maintain the same contact angle, the liquid needs to expand and thus the flow stops. In case 2, the direction out of the gap is just a little more difficult for a liquid to maintain the same contact angle, and thus the flow continues.

Figure 12:
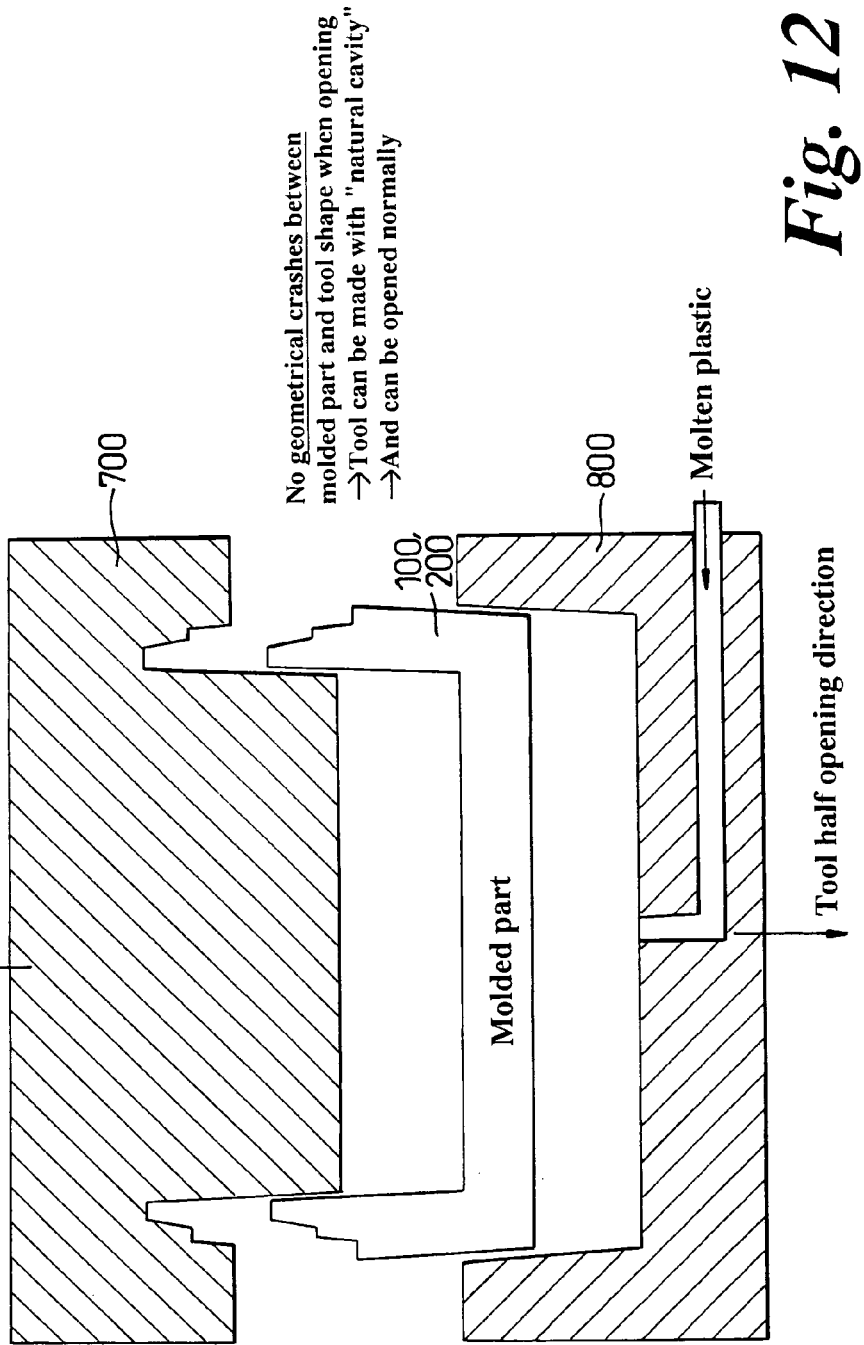

FIG. 12 illustrates two moulds 700, 800 which are brought together to define a cavity. The two moulds 700, 800 are shaped such that the cavity formed therebetween defines the shape of one of the casing parts 100,200. Molten plastic is injected through the lower mould into the cavity to produce an appropriately shaped moulded part 100, 200. The moulded part 100, 200 is removed from the mould by relative vertical movement of the moulds 700, 800.

Figure 13:
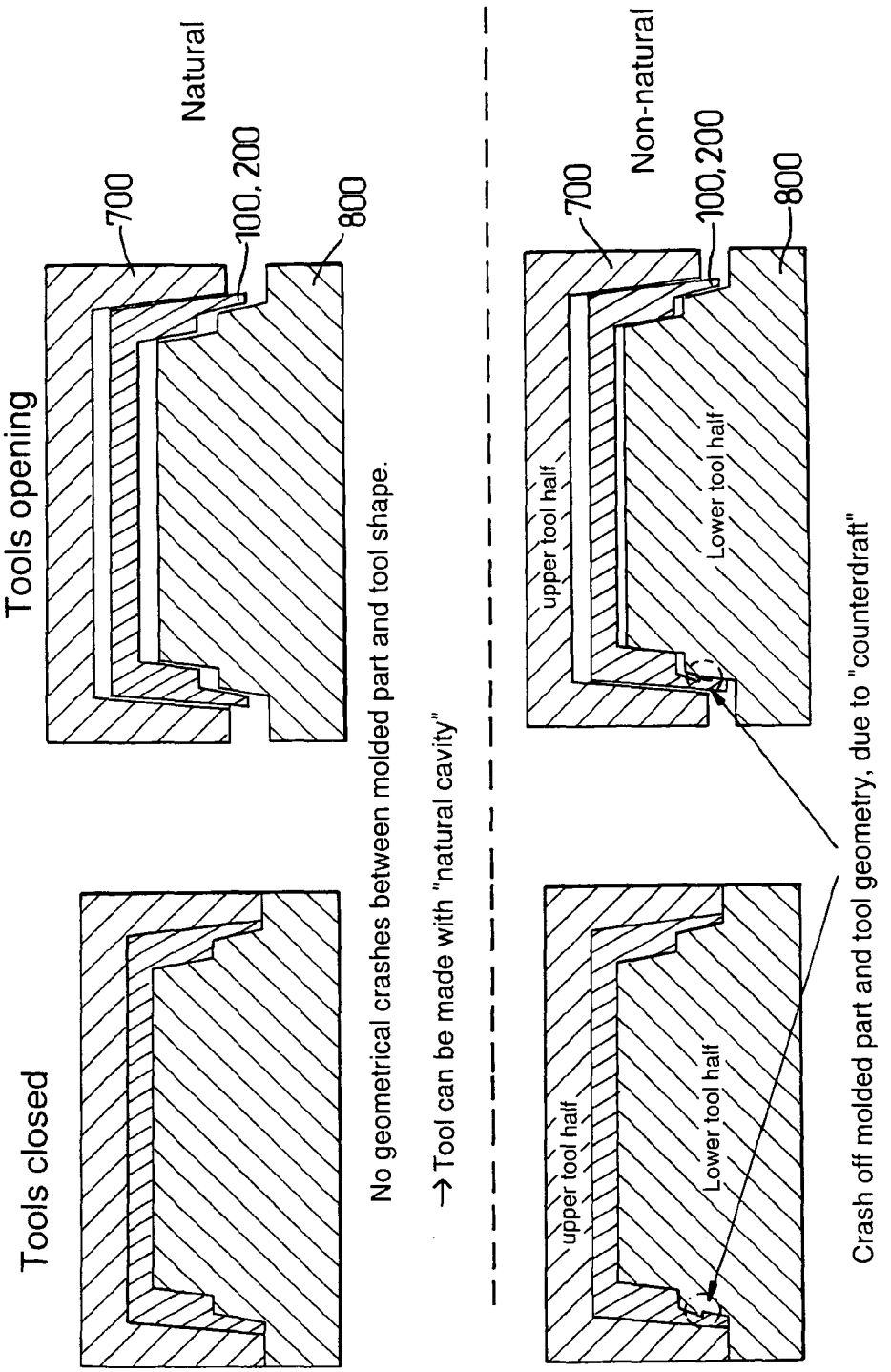

For ease of manufacture, the moulds 700, 800 are shaped such that no aspects of the moulded part 100, 200 project out in the horizontal plane. Thus, the relative vertical movement of the moulds 700, 800 is not interfered with by such projections (FIG. 13, natural).

If projections in horizontal planes (see inside circle in FIG. 13, non-natural) are required in the casing design, one or more of the moulds may have a movable core (FIG. 14). The moveable core projects out of the mould 700, 800 during the moulding process, but can be retracted inside the mould 700, 800 prior to the relative vertical movement of the mould parts 700, 800.

Figure 15:
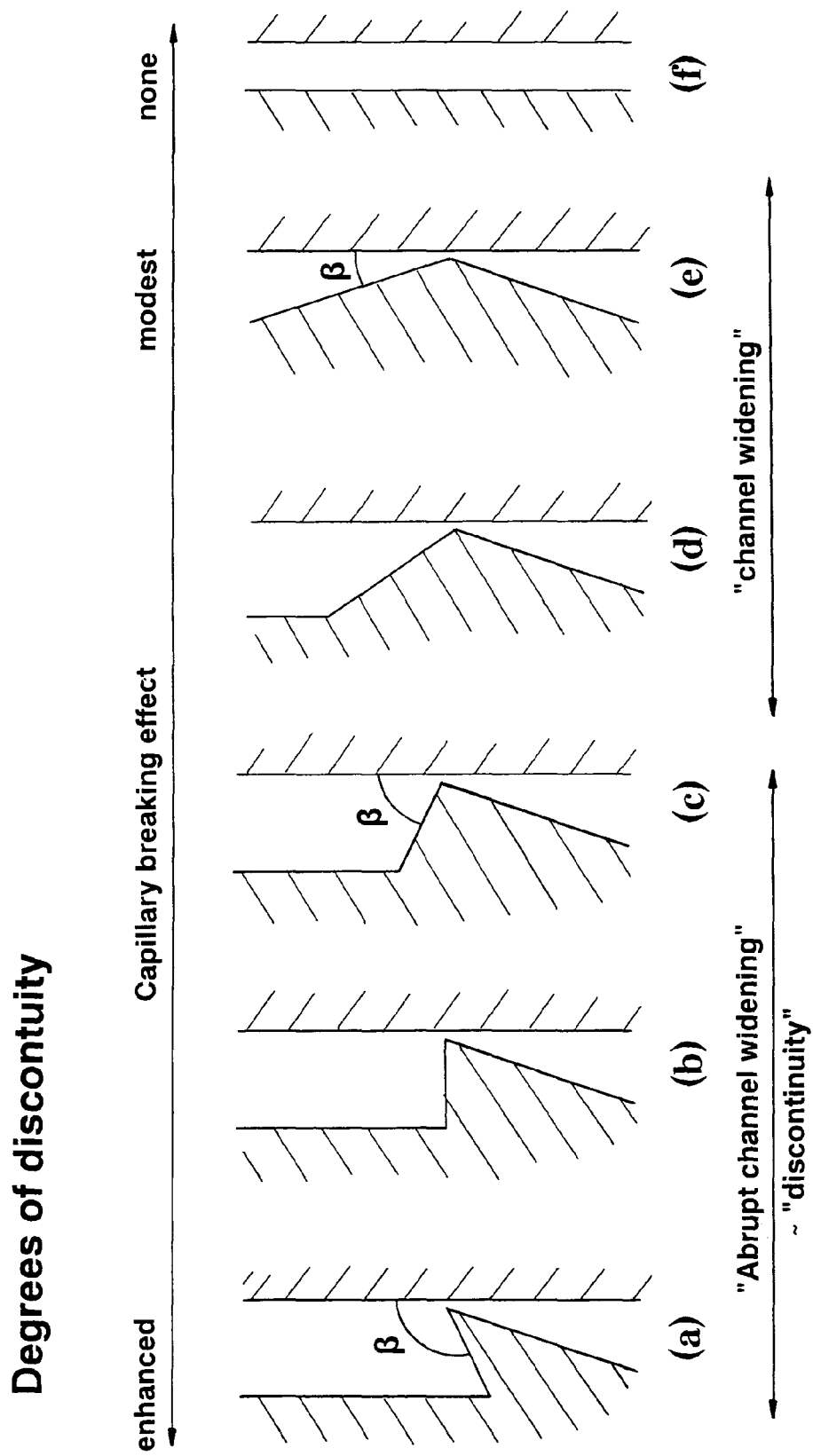
FIG. 15 illustrates various discontinuities (a)-(e) which are within the scope of the present invention.

FIG. 15 compares various types of discontinuity ranging from what can be considered as abrupt channel widenings (FIG. 15(*a*)-(*c*)) to gradual channel widenings (FIG. 15(*d*)-

(e)). FIG. 15(f) shows a continuous channel in which there is no discontinuity. Opening angles β, which provide the advantageous reduction in capillary action, can be determined by the person skilled in the art using routine experimentation. It has been determined that the critical angle $\beta_{crit}$ (the critical opening angle below which capillary action will not be inhibited) is based on the surface materials. In the case of glass, the step must be very sharp whereas in the case of certain plastics the angle is of the order of 50 degrees. It has also been determined that one criterion which could be used in the design of discontinuities is that the sum of the contact angles and discontinuity angles must be more than 180 degrees in the channel.

Figure 16:
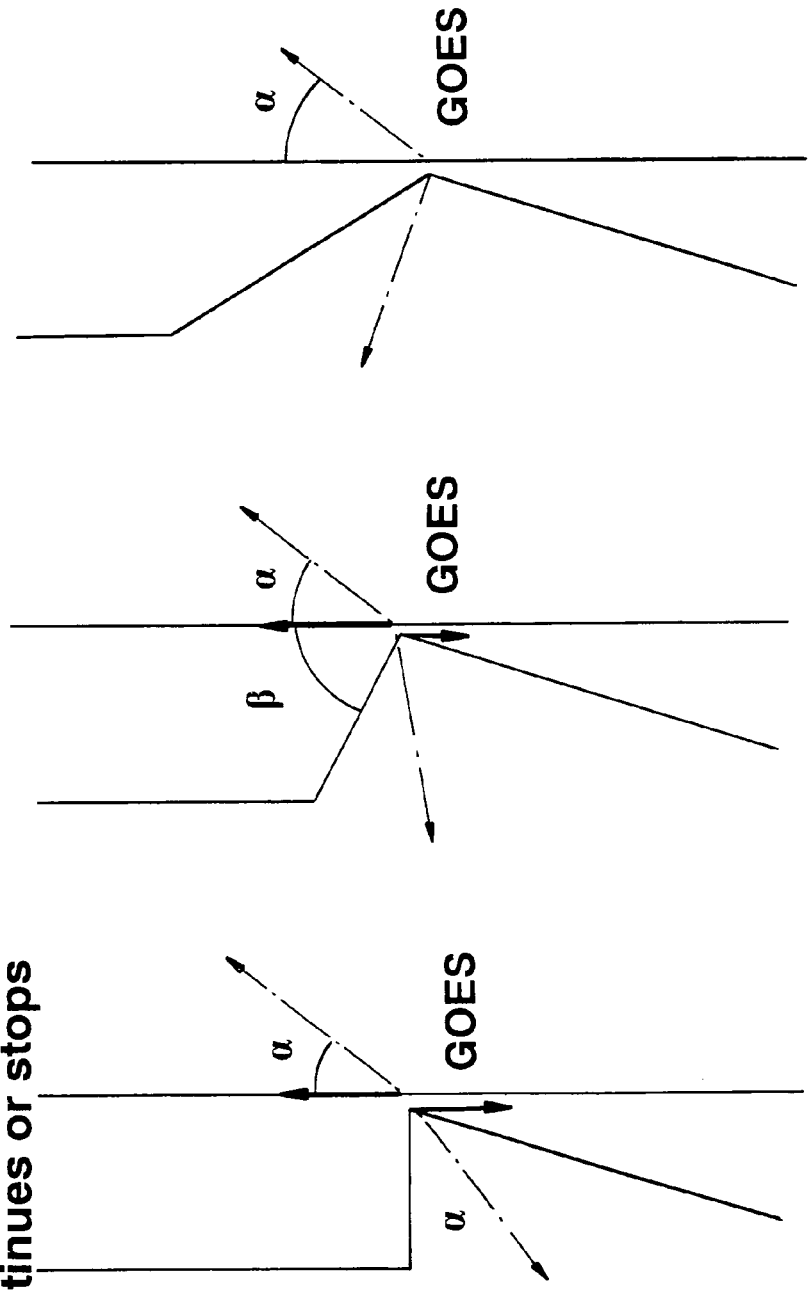
FIG. 16 illustrates (vertical) force components for various discontinuities providing a contact angle of 40.
Figure 17:
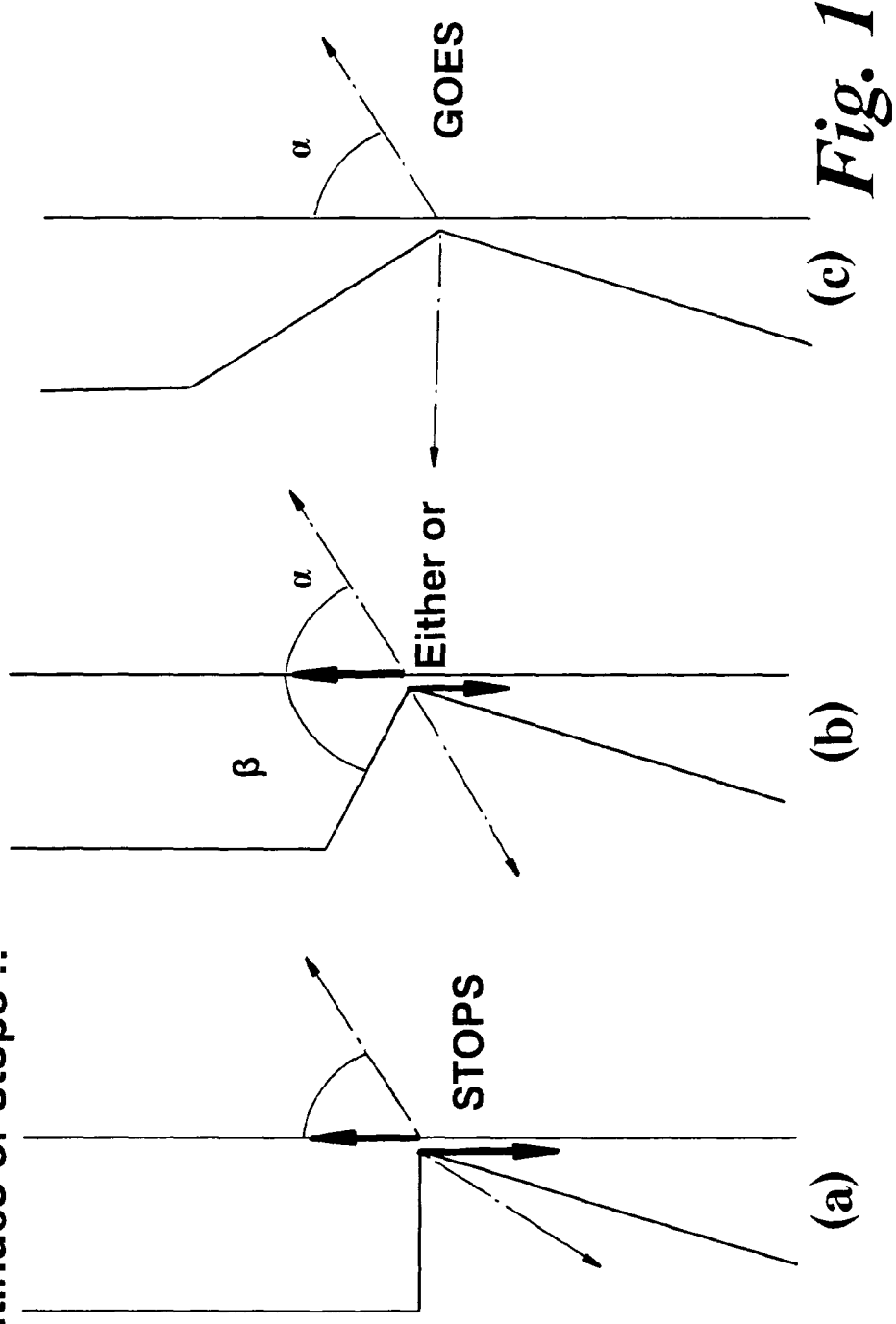
FIG. 17 illustrates (vertical) force components for various discontinuities providing a contact angle of 60.
Figure 18:
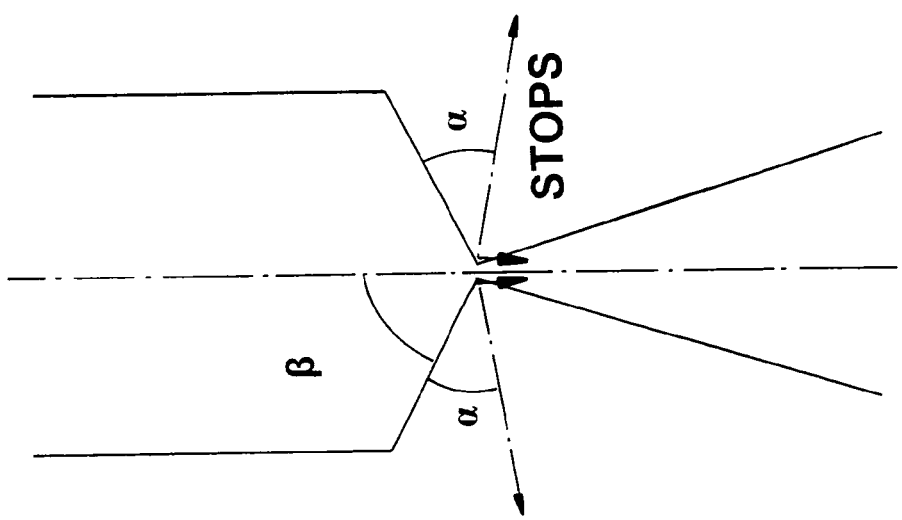
FIG. 18 illustrates a two sided discontinuity.

FIGS. 16-18 illustrate the importance of the sum of the (vertical) force components in the determination of whether capillary action continues or stops. In the figures, the channels are oriented to the vertical. However, this may not be the case in all embodiments. In more general terms, the sum of the force components in the direction of the channel (at the discontinuity) is important. Thus, if the force component in one channel direction is greater than the force component in the opposing channel direction, the greater force component will determine whether or not capillary action is inhibited.

Factors which affect the sum of the force components are the contact angle α (based on material properties) and the discontinuity opening angle β. FIGS. 16 and 17 compare three different discontinuity geometries (with correspondingly different opening angles) for a contact angle of 40 degrees and 60 degrees respectively. FIG. 16 shows that even sharp discontinuity angles will not stop capillary action for low contact angles (e.g. 40 degrees). In such a case, one might have to use an even greater discontinuity (FIG. 18) to inhibit capillary action for such a low contact angle. In FIG. 17 it is shown that for a higher contact angle of 60 degrees, certain opening angles will inhibit capillary action (FIG. 17a) whereas others will not (FIG. 17c), and an intermediate opening angle may or may not inhibit capillary action.

It will be appreciated that the contact angle is affected by surface coatings applied to the materials forming the channel. So, for example, a Teflon or wax/shoe polish coating applied to the material will affect the contact angle.

The present invention can also be applied to protecting the PWB onto which a keypad dome sheet is placed. The present prior art solution comprises gluing the dome sheet 10 to the PWB 20 (FIG. 19a). However, gluing is not always possible or recommended. A discontinuity can be provided by modifying the structure of the dome sheet and/or the PWB (FIG. 19b). The aforementioned principles can be used to inhibit capillary action and thus inhibit the ingress of liquid between the PWB and the dome sheet.

It will be appreciated that various modifications can be made to the present invention without departing from the scope of the present invention. For example, the mating parts can be mated/brought together using a snap fitting arrangement, using screws, taping, gluing, and/or welding. The channel may not be defined around the entire perimeter of the casing, and may exist only in a portion of it (for example if the join is not homogeneous/continuous). The casing may be formed form a plastic or a metal. The casing may be coated, for example, by a slip resistant coating along their mating edges (even though embodiments of the invention may reduce the requirement for such coatings).

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A casing comprising first and second parts having respective mateable surfaces having one or more mateable edges, the mateable edges being arranged to define a channel therebetween in the mated condition, the channel extending from an exterior of the casing towards an interior of the casing, wherein the channel is arranged to narrow from the exterior of the casing, wherein the channel is arranged to comprise a discontinuity in a channel dimension which is formed at a point at which the channel is narrowing in a direction towards the interior, and wherein the discontinuity is arranged to provide an abrupt increased gap with respect to an adjacent portion of the channel.

2. A casing as claimed in claim 1, wherein the discontinuity is arranged to re-orientate the direction of surface tension force in the channel to increase an amount of energy required for capillary flow from the casing exterior to the casing interior.

3. A casing as claimed in claim 1, wherein the discontinuity comprises a corner.

4. A casing as claimed in claim 1, wherein the discontinuity comprises opposing corners.

5. A casing as claimed in claim 1, wherein the discontinuity is formed in the channel towards the exterior of the casing.

6. A casing as claimed in claim 1, wherein the discontinuity is arranged to provide an abrupt increased gap with respect to an adjacent portion of the channel, the adjacent portion of the channel being towards the exterior of the casing.

7. A casing as claimed in claim 1, wherein the discontinuity is formed in the channel towards the interior of the casing.

8. A casing as claimed in claim 1, wherein the discontinuity is formed in the channel in the middle between the interior and exterior of the casing.

9. A casing as claimed in claim 1, wherein the discontinuity is arranged to narrow towards the interior of the casing to provide a reduced gap towards the interior of the casing.

10. A casing as claimed in claim 1, wherein the channel, after the discontinuity, is arranged to narrow towards the interior of the casing to provide a gradually reducing gap towards the interior of the casing.

11. A casing as claimed in claim 1, wherein the discontinuity is arranged to comprise an abrupt narrowing of the channel gap towards the interior of the casing.

12. A casing as claimed in claim 1, wherein the channel is arranged to define a first gap at the exterior of the casing, and a second narrower gap towards the interior of the casing, and wherein the discontinuity is formed at the second narrower gap.

13. A casing as claimed in claim 1, wherein the channel is formed from an opening in the injection moulding tool used to form the casing.

14. A casing as claimed in claim 1, wherein the first and second parts form an exterior casing for an electronic device.

15. A casing as claimed in claim 1, wherein the first and second parts form an exterior casing for one or more components of an electronic device.

16. A casing as claimed in claim 1, wherein the first and second parts form an interior casing for an electronic device.

17. A casing as claimed in claim 1, wherein the first and second parts form an interior casing for one or more components of an electronic device.

18. A casing as claimed in claim 1, wherein the first part is a Printed Wiring Board and the second part is a keypad dome sheet.

19. A casing as claimed in claim 1, wherein the channel extends radially around the perimeter of the casing.

20. A casing as claimed in claim 1, wherein the channel extends radially around the complete perimeter of the casing.

21. A casing part of a casing as claimed in claim 1.

22. A mould for producing a casing as claimed in claim 1.

23. An electronic device, comprising a casing as claimed in claim 1.

24. A method comprising manufacturing a casing, the casing comprising first and second parts having respective mateable surfaces having one or more mateable edges, the mating edges being arranged to define a channel therebetween in the mated condition, the channel extending from an exterior of the casing towards an interior of the casing, wherein the channel is arranged to narrow from the exterior of the casing, wherein the channel is arranged to comprise a discontinuity in a channel dimension which is formed at a point at which the channel is narrowing in a direction towards the interior, and wherein the discontinuity is arced to provide an abrupt increased gap with respect to an adjacent portion of the channel.

25. An electronic device comprising a casing as claimed in claim 1.

26. A means for housing one or more electronic components for an electronic device in the interior of the means for housing, the means for housing comprising:
first and second means for housing parts having respective conforming faces arranged to be able to be brought together such that the means for housing provides a housing for one or more of the electronic components, wherein the conforming faces are arranged to define one or more means for liquid access therebetween in the brought together condition, the one or more of the means for liquid access extending from an exterior of the means for housing towards an interior of the means for housing, wherein one or more of the means for liquid access is arranged to comprise a discontinuity in a dimension of the one or more of the means for liquid access; wherein the one or more of the means for liquid access is arranged to narrow from the exterior of the means for housing and wherein the discontinuity is formed at a point at which the one or more of the means for liquid access is narrowing in a direction towards the interior, and wherein the discontinuity is arranged to provide an abrupt increased gap with respect to an adjacent portion of the means for liquid access.

27. A method of assembling a casing for housing one or more electronic components for an electronic device in the casing interior, the casing comprising first and second parts having respective mateable surfaces having one or more mateable edges, the mateable edges being arranged to define a channel therebetween in the mated condition, the channel extending from an exterior of the casing towards an interior of the casing, wherein the channel is arranged to narrow from the exterior of the casing, wherein the channel is arranged to comprise a discontinuity in a channel dimension which is formed at a point at which the channel is narrowing in a direction towards the interior, wherein the discontinuity is arranged to provide an abrupt increased gap with respect to an adjacent portion of the channel, and wherein the method comprises assembling the first and second parts to define the channel between the first and second parts in the mated condition.

* * * * *

UNITED STATES PATENT AND TRADEMARK OFFICE
CERTIFICATE OF CORRECTION

PATENT NO. : 8,431,819 B2
APPLICATION NO. : 12/300109
DATED : April 30, 2013
INVENTOR(S) : Jussi Pitkonen et al.

It is certified that error appears in the above-identified patent and that said Letters Patent is hereby corrected as shown below:

In the Claims:
Claim 24:
Column 12, line 2, "arced" should be -- arranged --.

Signed and Sealed this
Twenty-fifth Day of June, 2013

Teresa Stanek Rea
*Acting Director of the United States Patent and Trademark Office*